(12) United States Patent
Yamauchi et al.

(10) Patent No.: US 10,957,415 B2
(45) Date of Patent: Mar. 23, 2021

(54) NAND FLASH MEMORY AND READING METHOD THEREOF

(71) Applicant: Winbond Electronics Corp., Taichung (TW)

(72) Inventors: Kazuki Yamauchi, Kanagawa (JP); Katsutoshi Suito, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 83 days.

(21) Appl. No.: 15/599,487

(22) Filed: May 19, 2017

(65) Prior Publication Data

US 2018/0053568 A1 Feb. 22, 2018

(30) Foreign Application Priority Data

Aug. 18, 2016 (JP) .............................. JP2016-160378

(51) Int. Cl.
*G11C 29/52* (2006.01)
*G11C 16/34* (2006.01)
(Continued)

(52) U.S. Cl.
CPC .......... *G11C 29/52* (2013.01); *G06F 12/0246* (2013.01); *G11C 7/20* (2013.01);
(Continued)

(58) Field of Classification Search
None
See application file for complete search history.

(56) References Cited

U.S. PATENT DOCUMENTS 8,413,015 B2 * 4/2013 Cheng ................. G06F 11/1044
714/763
2012/0216094 A1 8/2012 Yoo et al.
(Continued)

FOREIGN PATENT DOCUMENTS

CN 1677565 10/2005
CN 103219043 7/2013
(Continued)

OTHER PUBLICATIONS

"Office Action of Korea Counterpart Application", dated Aug. 16, 2018, with English translation thereof, p. 1-p. 9.
(Continued)

*Primary Examiner* — Gary W. Cygiel
(74) *Attorney, Agent, or Firm* — JCIPRNET

(57) ABSTRACT

An NAND flash memory and a reading method thereof capable of high-speed reading of SFDP data are provided. The flash memory includes a memory cell array, a page buffer/reading circuit 170 and a controller 150. The page buffer/reading circuit 170 includes a first latch circuit L1 and a second latch circuit L2. The first latch circuit L1 keeps data read from the memory cell array. The second latch circuit L2 keeps data transferred from the first latch circuit L1. Just after power is turned on or reset, the controller 150 controls data of block 0/page 0 of the memory cell array to be kept in the second latch circuit L2 and controls the SFDP data to be kept in the first latch circuit L1. The SFDP data or the data of block 0/page 0 is serially output according to an input command.

10 Claims, 6 Drawing Sheets

(51) Int. Cl.
  *G11C 29/04* (2006.01)
  *G11C 16/04* (2006.01)
  *G11C 7/20* (2006.01)
  *G11C 16/26* (2006.01)
  *G06F 12/02* (2006.01)
(52) U.S. Cl.
  CPC .......... *G11C 16/0483* (2013.01); *G11C 16/26* (2013.01); *G11C 16/3404* (2013.01); *G11C 29/04* (2013.01); *G06F 2212/1032* (2013.01); *G06F 2212/7203* (2013.01); *G11C 2029/0411* (2013.01)

(56) References Cited

U.S. PATENT DOCUMENTS

| | | | |
|---|---|---|---|
| 2014/0104947 A1* | 4/2014 | Yamauchi | G11C 16/0483 365/185.09 |
| 2014/0108895 A1 | 4/2014 | Fujiwara | |
| 2014/0223198 A1 | 8/2014 | Saranghar et al. | |
| 2014/0269065 A1* | 9/2014 | Jigour | G11C 29/04 365/185.09 |
| 2014/0297922 A1 | 10/2014 | Sarangdhar et al. | |
| 2015/0277930 A1 | 10/2015 | Sarangdhar, V. et al. | |
| 2016/0026783 A1* | 1/2016 | Buer | G06F 21/34 711/103 |
| 2016/0034352 A1 | 2/2016 | Michael et al. | |

FOREIGN PATENT DOCUMENTS

| | | |
|---|---|---|
| CN | 103730159 | 4/2014 |
| CN | 104425014 | 3/2015 |
| CN | 106030525 | 10/2016 |
| JP | 2013235642 | 11/2013 |
| KR | 20050096445 | 10/2005 |
| TW | 201603242 | 1/2016 |

OTHER PUBLICATIONS

"Office Action of China Counterpart Application", dated Jun. 1, 2020, p. 1-p. 11.
"Office Action of Korea Counterpart Application" with English translation thereof, dated Apr. 9, 2020, p. 1-p. 11.

* cited by examiner

NAND FLASH MEMORY AND READING METHOD THEREOF

CROSS-REFERENCE TO RELATED APPLICATION

This application claims the priority benefit of Japan application serial no. 2016-160378, filed on Aug. 18, 2016. The entirety of the above-mentioned patent application is hereby incorporated by reference herein and made a part of this specification.

BACKGROUND OF THE INVENTION

1. Field of the Invention

The invention relates to an NAND flash memory, and particularly relates to reading involving serial flash discoverable parameter (SFDP).

2. Description of Related Art

The NAND flash memory has become more and more integrated through years. Thus, it is difficult to manufacture a memory device without any defect or flaw. Therefore, a redundant scheme on a memory chip is adopted to apparently repair a physical flaw of a memory device caused in a manufacturing process. For example, in a certain redundant scheme, a memory device having a physical flaw is repaired by setting up a redundant memory. Moreover, further to making correction physically with the redundant memory, an error checking correction (ECC) circuit is also available as a soft error solution.

In the NAND flash memory of Patent Document 1, a high-speed cache register includes two parts. When one of the parts outputs data, an error checking correction code computation is performed on the data of the other part. Accordingly, the delay of the error checking correction code computation is eliminated from the output, so as to read data at a high speed.

CURRENT TECHNICAL DOCUMENTS

Patent Documents

[Patent Document 1] Japanese Patent Publication No. 2013-235642

Issue to be Solved

In an NOR flash memory mounted with a serial peripheral interface (SPI) function, parameters such as device identification (ID), function, configuration information, and the like stored in an address space not accessible to the user for programming (for the ease of descriptions, such parameters are referred to as SFDP data or parameter data in the following), and the SFDP data may be read externally. Since the NOR flash memory adopts such configuration, the reading speed of the NOR flash memory is fast, and the SFDP data may be read without latency, or the SFDP data may be output synchronously with a serial clock SCK with a very short access delay time.

Some NAND flash memories are also mounted with the SPI function. For an NAND flash memory with the SPI function, the compatibility with the NOR flash memory in terms of reading the SFDP data is required. However, differing from the NOR flash memory, the NAND flash memory reads data from a memory array at a slower speed. Therefore, it is difficult for the NAND flash memory to output the SFDP data without latency.

SUMMARY OF THE INVENTION

The invention provides an NAND flash memory and a reading method thereof capable of reading apparatus-related parameter data without latency or with a short delay time.

Technical Means

In a reading method of an NAND flash memory according to an embodiment of the invention, the NAND flash memory includes a page buffer having a first data keeping part keeping data read from a memory cell array and a second data keeping part keeping data transferred from the first data keeping part. In addition, the NAND flash memory outputs the data kept in the second data keeping part in response to an external clock. In the reading method, after power is just turned on or reset, data stored in a designated page of the memory cell array are kept in the second data keeping part, and parameter data relating to a device and stored in an area not accessible to an user for programming are kept in the first data keeping part. In addition, reading of the parameter data or the data of the designated page is controlled based on an input command.

Preferably, the parameter data kept in the first data keeping part are transferred to the second data keeping part under a circumstance that a command of reading the parameter data is input. Preferably, the data of the designated page kept in the second data keeping part are output under a circumstance that a command of reading the designated page is input.

In a reading method of an NAND flash memory according to an embodiment of the invention, the NAND flash memory includes a page buffer having a first data keeping part keeping data read from a memory cell array and a second data keeping part keeping data transferred from the first data keeping part. In addition, the NAND flash memory outputs the data kept in the second data keeping part in response to an external clock. In the reading method, after power is just turned on or reset, parameter data stored in an area not accessible to the user for programming are kept in the second data keeping part, data stored in a designated page of the memory cell array are kept in the first data keeping part, and an error checking correction process is performed on the parameter data during a period of reading the data of the designated page. In addition, reading of the parameter data or the data of the designated page is controlled based on an input command.

Preferably, the parameter data kept in the second data keeping part and already finishing with the error checking correction process are output under a circumstance that a command of reading the parameter data is input. Preferably, the data kept in the first data keeping part are transferred to the second data keeping part under a circumstance that a command of reading the designated page is input.

An NAND flash memory according to an embodiment of the invention includes: a memory cell array; a page buffer, having a first data keeping part and a second data keeping part, wherein the first data keeping part keeps data read from the memory cell array, and the second data keeping part keeps data transferred from the first data keeping part; and a read control element, performing control on reading the data kept in the second keeping part to the external. After power is just turned on or reset, the read control element keeps data stored in a designated page of the memory cell array in the second data keeping part, and keeps parameter data stored in an area not accessible to the user for programming in the first data keeping part, and controls reading of the parameter data or the data of the designated page based on an input command.

An NAND flash memory according to an embodiment of the invention includes: a memory cell array; a page buffer, having a first data keeping part and a second data keeping part, wherein the first data keeping part keeps data read from the memory cell array, and the second data keeping part keeps data transferred from the first data keeping part; and an error checking correction process element, capable of performing an error checking correction process on the data kept in the second data keeping part; and a read control element, performing control on reading the data kept in the second keeping part to the external. After power is just turned on or reset, the read control element performs the error checking correction process on parameter data, and controls reading of the parameter data or the data of the designated page based on an input command during keeping the parameter data stored in an area not accessible to the user for programming in the second data keep part and keeping data stored in a designated page of the memory cell array in the first data keep part.

Inventive Effect

According to the embodiments of the invention, the apparatus-related parameter data are kept in the page buffer from the memory cell array during a period from the power is turned on or reset until an operation starts. Therefore, the parameter data may be read without latency or within a very short period of time. In addition, the function of reading parameter data of an NOR flash memory is compatible.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
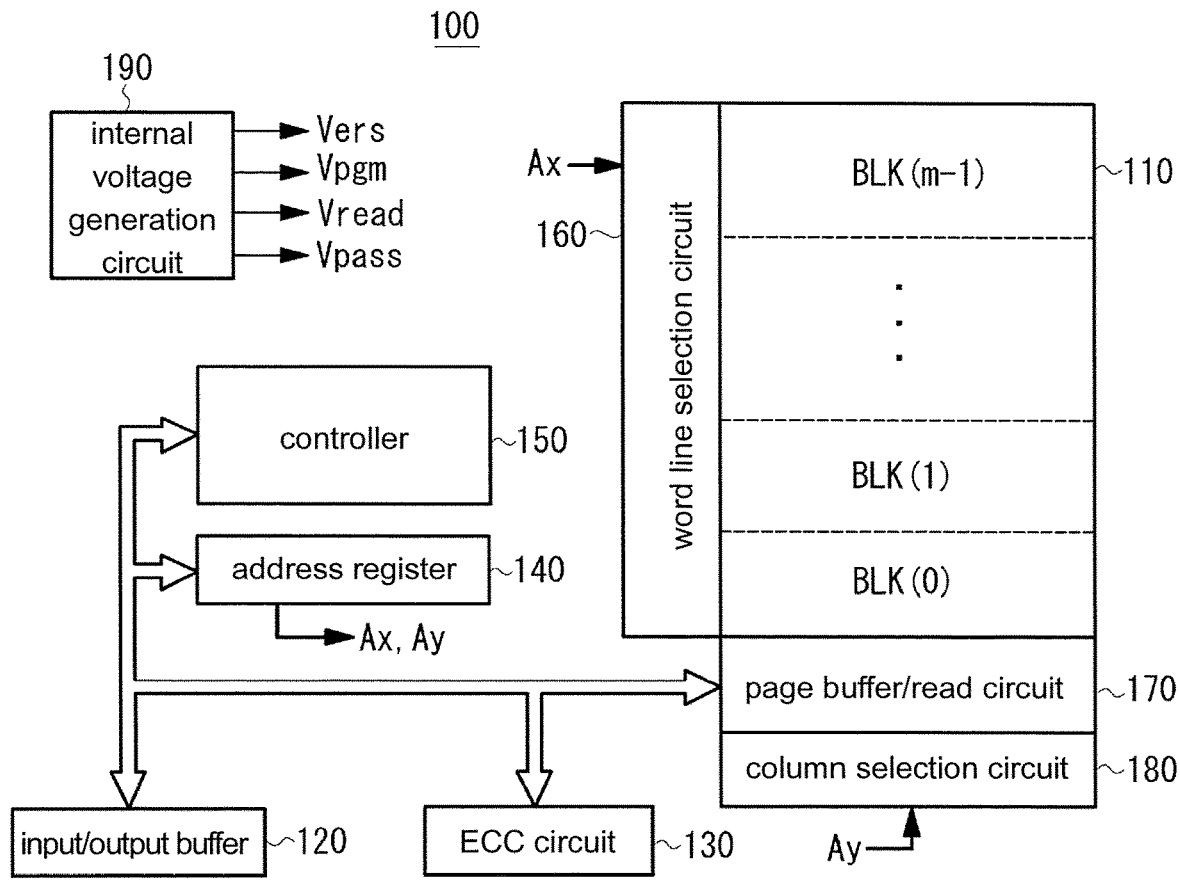
FIG. 1 is a view illustrating a configuration of an NAND flash memory according to an embodiment of the invention.

Reference will be made to the accompany drawings to describe the embodiments of the invention in detail. In addition, it should be noted that, for the ease of understanding, the respective parts are emphasized in the drawings. Therefore, the scales in the drawings are different from the scales of the actual apparatuses.

Embodiments

FIG. 1 is a view illustrating a configuration of an NAND flash memory according to an embodiment of the invention. A flash memory 100 of the embodiment includes a memory array 110, an input/output buffer 120, an error checking correction (ECC) circuit 130, an address register 140, a controller 150, a word line selection circuit 160, a page buffer/read circuit 170, a column selection circuit 180, and an internal voltage generation circuit 190. The memory array 110 includes a plurality of memory cells arranged into a matrix. The input/output buffer 120 is connected to an external input/output terminal I/O to keep input/output data. The ECC circuit 130 performs error checking/correction on data programmed to or read from the memory array 110. The address register 140 receives address data from the input/output buffer 120. The controller 150 controls the respective parts based on command data or a control signal from an external host apparatus. The word line selection circuit 160 receives row address information Ax from the address register 140, decodes the row address information Ax, and selects a block and a word line based on a decode result. The page buffer/read circuit 170 keeps data read from a page selected by the word line selection circuit 160 or keep data to be programmed to the selected page. The column selection circuit 180 receives column address information Ay from the address register 140, decodes the column address information Ay, and selects a column in the page buffer/read circuit 170 based on a decode result. The internal voltage generation circuit 190 generates various voltages (e.g., write voltage Vpgm, pass voltage Vpass, read pass voltage Vread, erase voltage Vers, etc.) required to perform data reading, programming, and erasing, etc.

The memory array 110 includes m storage blocks BLK (0), BLK(1), . . . , BLK(m−1) are arranged along a column direction. The storage block includes a plurality of NAND strings formed by serially connecting a plurality of memory cells. The NAND strings may be in a form of a two-dimensional array formed on surface of a substrate, or in a form of a three-dimensional array formed by a semiconductor layer on the surface of the substrate. Besides, the memory cell may be a single level cell (SLC) storing one bit of data (binary data) or a multi-level cell (MLC) storing a plurality of bits.

Figure 2:
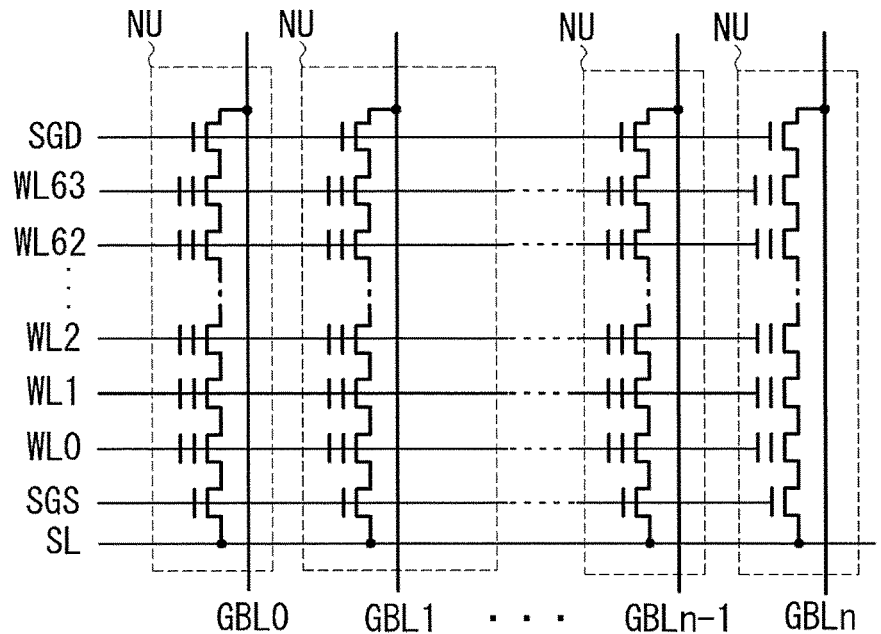
FIG. 2 is a circuit view illustrating an NAND string in a block of a memory cell array.

In a block, as shown in FIG. 2, a plurality of NAND string units NU formed by serially connecting a plurality of memory cells are formed. As shown in the figure, in a block, n+1 NAND string units NU are arranged along a row direction. The NAND string unit NU includes a plurality of memory cells (the figure illustrates 64 memory cells as an example) in serial connection, a bit line side selection transistor connected to a drain side of a memory cell at a terminal part, and a source line side selection transistor connected to a source side of a memory cell. A drain of the bit line selection transistor is connected to a corresponding bit line GBL of bit lines GBL0 to GBLn, and a source of the source side selection transistor is connected to a common source line SL.

Table 1 is a table with an example of bias voltages applied for performing respective operations of the flash memory. In a read operation, a positive voltage is applied to the bit line, a voltage (e.g., 0V) is applied to a selected word line, the pass voltage Vpass (e.g., 4.5V) is applied to a non-selected word line, a positive voltage (e.g., 4.5V) is applied to a selected gate line SGD and a selected gate line SGS to turn on the bit line side selection transistor and the source side selection transistor of the NAND string, and 0V is applied to the common source line. In a programming (write) operation, a high-voltage programming voltage Vpgm (15V to 20V) is applied to the selected word line, and an intermediate voltage (e.g., 10V) is applied to the non-selected word line, such that the bit line side selection transistor is turned on, the source side selection transistor is turned off, and a voltage corresponding to data "0" or "1" is supplied to the bit line. In an erase operation, 0V is applied to the selected word line in the block, and a high voltage (e.g., 21V) is applied to a P well, so as to extract electrons of a floating gate to the substrate, thereby erasing data with block as a unit.

TABLE 1

|  | Erase | Write | Read |
|---|---|---|---|
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P well | 21 | 0 | 0 |

The ECC circuit 130 may be set to be enabled or disabled based on a command or a factory setting. When an on-chip ECC function is enabled, the ECC circuit 130 performs computation on data transferred by the page buffer/read circuit 170 when programming data input through the input/output buffer 120 in a programming operation are loaded to the page buffer/read circuit 170, so as to form an error checking correction code. The ECC computation is performed by means of a conventional process, such as parity check, hamming code, or Reed-Solomon code, etc., to convert input data of k bits or k bytes into p=k+q. "q" refers to the error checking correction code or a parity bit required for error checking correction. The ECC circuit 130 stores the generated error checking correction code to a spare area of the page buffer/read circuit 170. Accordingly, the data and error checking correction code set with respect to the page buffer/read circuit 170 are programmed to the selected page of the memory array 110.

Besides, in the read operation, when the data read from the selected page of the memory array 110 are kept in the page buffer/read circuit 170, the ECC circuit 130 performs error detection on the read data based on the data and error checking correction code transferred by the page buffer/read circuit 170. Under a circumstance that an error is detected, corrected data are set in the page buffer/read circuit 170. In addition, the data kept in the page buffer/read circuit 170 are output externally through the input/output buffer 120.

Figure 3:
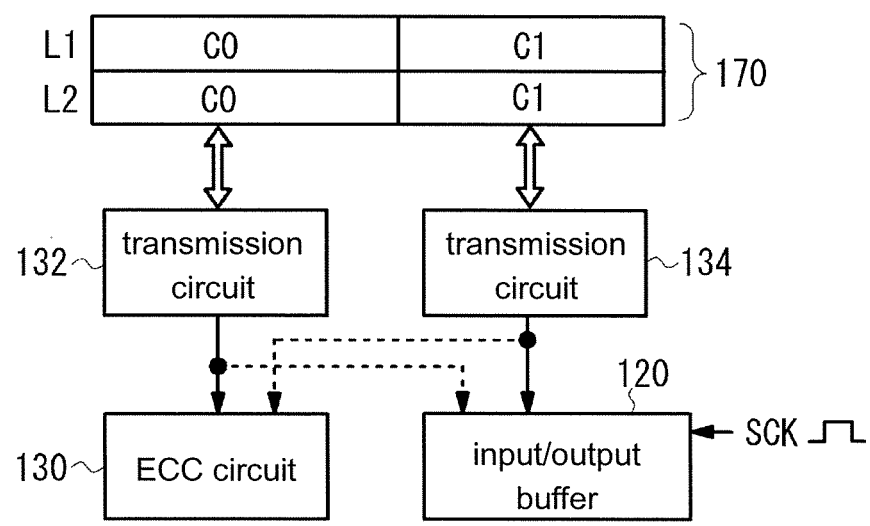
FIG. 3 is a view illustrating operation of a first latch circuit and a second latch circuit of a page buffer/read circuit.

In the following, latch circuits in the page buffer/read circuit 170 are described in detail. As shown in FIG. 3, the page buffer/read circuit 170 includes a first latch circuit L1 and a second latch circuit L2. The first latch circuit L1 keeps data read from a memory cell array or data programmed to the memory cell array. The second latch circuit L2 is in bilateral data transfer with the first latch circuit L1. The first latch circuit L1 may keep one page of data (e.g., 2 KB) and has a first high-speed buffer part C0 (e.g. 1 KB) and a second high-speed buffer part C1 (e.g., 1 KB).

The second latch circuit L2 may also keep one page of data, and has the first high-speed buffer part C0 and the second high-speed buffer part C1. Between the first latch circuit L1 and the second latch circuit L2, a transfer circuit not shown herein is provided, so as to carry out bilateral data transfer between the first latch circuit L1 and the second latch circuit L2 via the transfer circuit. The respective first high-speed buffer parts C0 and the second high-speed buffer parts C1 of the first latch circuit L1 and the second latch circuit L2 are capable of independently keeping or transferring data. For example, data kept in the first high-speed buffer part C0 of the first latch circuit L1 may be transferred to the first high-speed buffer part C0 of the second latch circuit L2, or data kept in the second high-speed buffer part C1 of the first latch circuit L1 may be transferred to the second high-speed buffer part C1 of the second latch circuit L2.

In addition, between the second latch circuit L2, the ECC circuit 130, and the input/output buffer 120, a first transfer circuit 132 and second transfer circuit 134 for bilateral data transfer are disposed. The first transfer circuit 132 may perform data transfer between the first high-speed buffer part C0 of the second latch circuit L2, the ECC circuit 130, and the input/output buffer 120. The second transfer circuit 134 may perform data transfer between the second high-speed buffer part C1 of the second latch circuit L2, the ECC circuit 130, and the input/output buffer 120.

When the first transfer circuit 132 transfers the data of the first high-speed buffer part C0 to the ECC circuit 130, the second transfer circuit 134 may transfer the data of the second high-speed buffer part C1 to the input/output buffer 120. Alternatively, when the first transfer circuit 132 transfers the data of the first high-speed buffer part C0 to the input/output buffer 120, the second transfer circuit 134 may transfer the data of the second high-speed buffer part C1 to the ECC circuit 130. Namely, during a period of outputting a half page of data to the second latch circuit L2, an ECC process is performed on a remaining half page of data, so as to continuously output page data finishing with the ECC process.

As a serial interface function of the flash memory 100, the input/output buffer 120 is capable of performing serial inputting and outputting synchronously with an external serial clock signal SCK. A bit width of serial input or serial output may be arbitrarily set as ×1, ×2, ×4, ×8, or the like.

In the following, a read operation of serial flash discoverable parameter (SFDP) data of the embodiment is described. The flash memory 100 of the embodiment is compatible with a read command of SFDP. When the read command of SFDP is input from the external host apparatus, the read operation of SFDP is performed. SFDP refers to parameter data relating to a device, such as device ID, function, configuration, and the like. Such parameter data are stored in an address space not accessible to the user for programming.

Normally, the SFDP data are utilized by the external host apparatus when the power of the flash memory 100 is just turned on or the flash memory 100 is reset. In other words, in the operation of the flash memory 100, the SFDP data are normally not read. Therefore, in the embodiment, the SFDP data may be read after the power of the flash memory is just turned on or reset. As long as the SFDP data are automatically read from the address space storing the SFDP data and configured in the page buffer/read circuit 170 during the period after the power is just turned on or reset and until the flash memory starts operating, the SFDP data may be read without latency or with a very short delay after the operation of the flash memory. Therefore, the NAND flash memory may be compatible with the requirement of the NOR flash memory on the reading time of the SFDP data.

However, the NAND flash memory has the following requirement. After the power is just turned on or reset, data of a designated page of a designated block (e.g., data of block 0/page0) of the memory array 110 need to be output immediately. Under such requirement, the data of block0/page0 are configured in the second latch circuit L2 of the page buffer/read circuit 170, so the SFDP data may not be configured in the second latch circuit L2. In the following, the data read from the designated page of the designated block after the power is just turned on or reset are referred to as "initial data" for the ease of description.

Accordingly, in the first embodiment, an arrangement is made after the power is just turned on or reset, so as to prevent the initial data from conflicting with the SFDP data. Namely, the initial data are configured in the second latch circuit L2, and the SFDP data are configured in the first latch circuit L1, and reading of the SFDP data or the initial data is controlled based on a subsequent input command.

Figure 4:
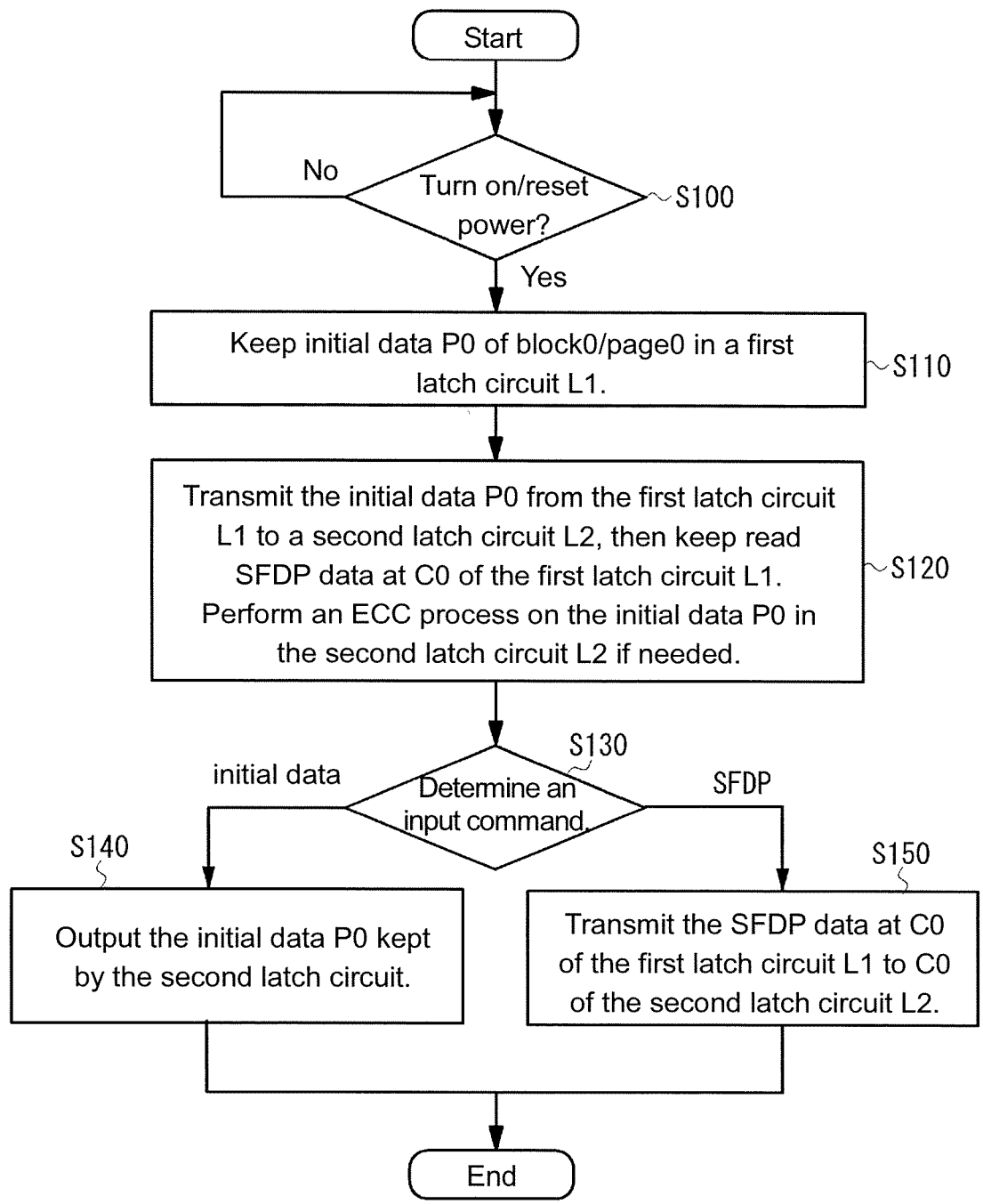
FIG. 4 is a flowchart illustrating a read operation of serial flash discoverable parameter (SFDP) data according to a first embodiment of the invention.
Figure 5A:
FIGS. 5(A) to 5(F) are view illustrating transition of data kept in a first latch circuit and a second latch circuit according to the first embodiment of the invention.

FIG. 4 is a flowchart illustrating a read operation according to the first embodiment. In addition, FIGS. 5(A) to 5(F) illustrate transition of the data kept in the first latch circuit L1 and the second latch circuit L2. First of all, FIG. 5(A) illustrates initial states of the first latch circuit L1 and the second latch circuit L2. In the figure, it is assumed that the data size of one page is 2 KB, each of the first latch circuit L1 and the second latch circuit L2 keeps 2 KB of data, and each of the first high-speed buffer part C0 and the second high-speed buffer part C1 keeps a half page (i.e., 1 KB) of data. Besides, the SFDP data are less than a half page (i.e., less than 1 KB), such as 256 B.

Figure 5B:
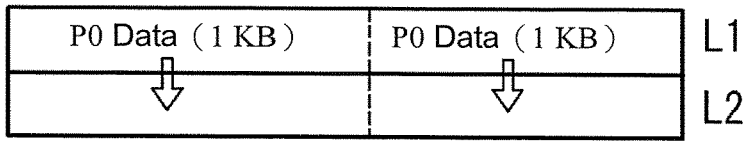

When the controller 150 turns on the power of the flash memory 100 or executes a reset command (S100), a sequence of reading the SFDP data or the initial data is performed. After the power is just turned on or reset, the controller 150 reads initial data P0 from the block 0/page0 of the memory array 110, for example. The read initial data P0 are kept in the first high-speed buffer part C0 and the second high-speed buffer part C1 of the first latch circuit L1. Such circumstance is shown in FIG. 5(B).

Figure 5C:
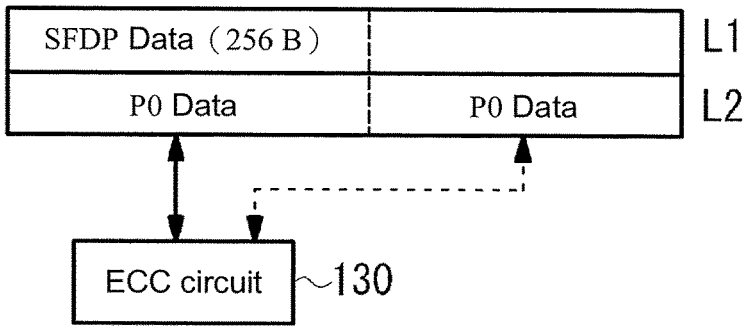

When the initial data of the designated page are read, the controller 150 transfers the initial data P0 of the first latch circuit L1 to the second latch circuit L2. After the transfer is finished, the SFDP data are immediately read from a page of an SFDP space. The read SFDP data are kept in the first high-speed buffer part C0 of the first latch circuit L1 (S120). If the ECC process on the initial data P0 is anticipated, during the period of reading the SFDP data from the memory cell array, the ECC process is performed on the initial data P0 of the first high-speed buffer part C0 of the second latch circuit L2. After the process is finished, the ECC process is performed on the initial data P0 of the second high-speed buffer part C1. In this case, the period of reading from the memory cell array is longer than the time of the ECC process on one page of data. Such circumstance is shown in FIG. 5(C).

Figure 5D:
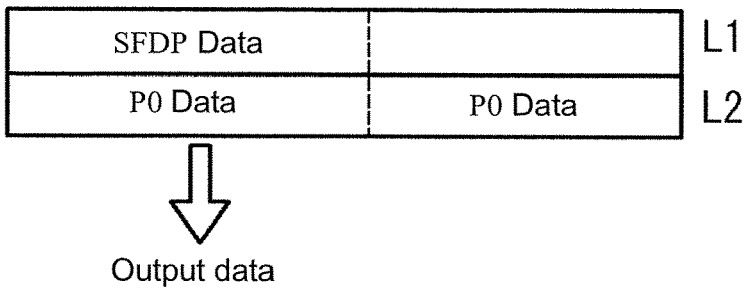

Then, the controller 150 determines an input command (S130). If a read command of the initial data is input, the controller 150 may transfer the initial data P0 of the first high-speed buffer part C0 of the second latch circuit L2 to the input/output buffer 120. The transferred initial data P0 are output to the external synchronously with the external serial clock signal SCK. Then, the initial data P0 of the second high-speed buffer part C1 of the second latch circuit L2 are serially output synchronously with the serial clock signal SCK. Such circumstance is shown in FIG. 5(D). In addition, under a circumstance that a column address read ahead is input from the external host apparatus, the initial data are serially output from the column address.

Figure 5E:
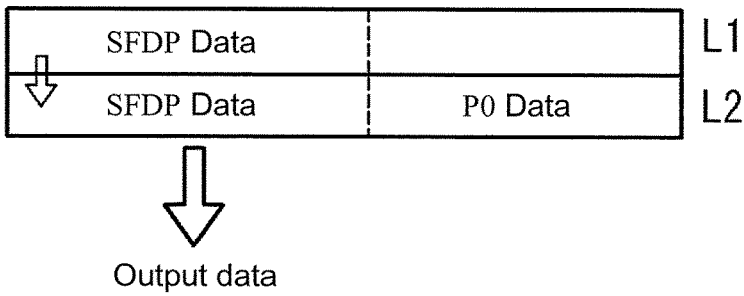

Besides, under a circumstance that the read command of SFDP is input, the controller 150 generates a transfer pulse in response to the command. With the transfer pulse, the SFDP data kept in the first high-speed buffer part C0 of the first latch circuit L1 are transferred to the first high-speed buffer part C0 of the second latch circuit L2 (S150). In addition, the SFDP data kept in the first high-speed buffer part C0 of the second latch circuit L2 are transferred to the input/output buffer 120, and are serially output synchronously with the external serial clock signal SCK. Such circumstance is shown in FIG. 5(E).

Therefore, according to the embodiment, the SFDP data and the initial data of the designated page are configured from the memory cell array to page buffer/read circuit 170 by utilizing an operation starting period after the power is just turned on or reset. Accordingly, the SFDP data or data of the page 0 may be read based on the input command after the operation just starts without latency.

Figure 5F:
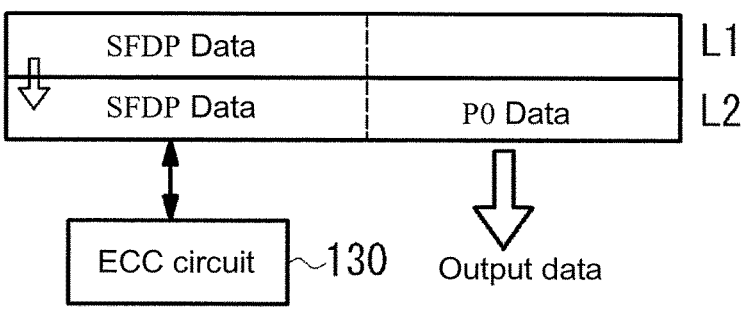

Moreover, in the read operation, under a circumstance that the read command of SFDP is input after the read command of the initial data is input, the SFDP data of the first high-speed buffer part C0 of the first latch circuit L1 are transferred to the first high-speed buffer part C0 of the second latch circuit L2 (overwriting the initial data) during the period of outputting the remaining half of the initial data P0 of the second high-speed buffer part C1 of the second patch circuit L2. Thus, the SFDP data of the first high-speed buffer part C0 may be output continuously after outputting the initial data P0 of the second high-speed buffer part C1. Such circumstance is shown in FIG. 5(F). Under such circumstance, the SFDP data may also be output with a very short delay time, compared with reading the SFDP data from the memory cell array. Besides, in the process of outputting the initial data P0 from the second high-speed buffer part C1, the ECC process on the SFDP data may also be performed. In this case, the period of outputting the initial data P0 of the second high-speed buffer part C1 is longer than the time of the ECC operation of the first high-speed buffer part C0.

Figure 6:
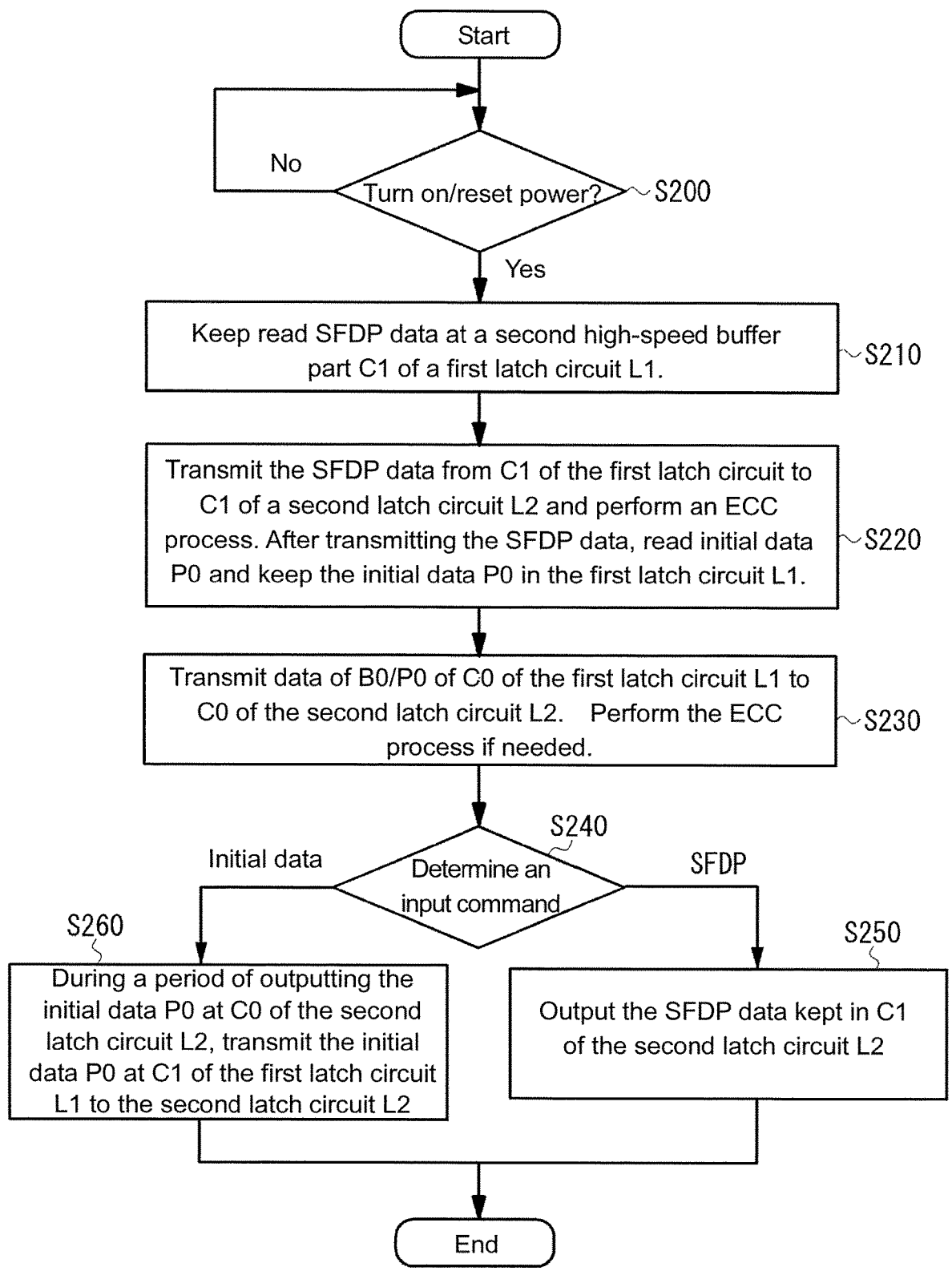
FIG. 6 is a flowchart illustrating a read operation of SFDP data according to a second embodiment of the invention.

In the following, a second embodiment of the invention is described in the following. According to the first embodiment, under the circumstance that the SFDP data are read without latency, the ECC process on the SFDP data is unable to be performed. However, in the second embodiment, the SFDP data already undergoing the ECC process may be read without latency. FIG. 6 is a flowchart illustrating a read operation of the second embodiment, and FIGS. 7(A) to 7(F) illustrate transition of the data kept in the first latch circuit and the second latch circuit.

Figure 7A:
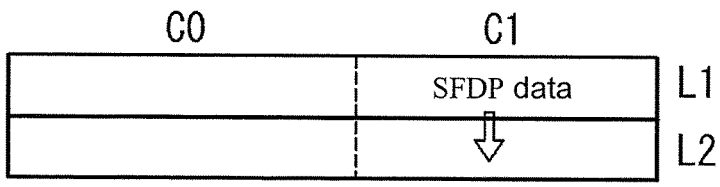
FIGS. 7(A) to 7(F) are view illustrating transition of data kept in a first latch circuit and a second latch circuit according to the second embodiment of the invention.

The controller 150 performs inspection after the power is just turned on or reset (S200). The controller 150 reads the SFDP data from the memory array 110 after the power is just turned on or reset. The read SFDP data are kept in the second high-speed buffer part C1 of the first latch circuit L1 (S210). Such circumstance is shown in FIG. 7(A).

Figure 7B:
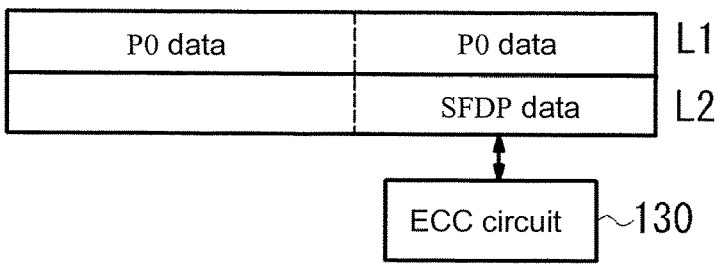

After reading the SFDP data, the controller 150 transfers the SFDP data of the second high-speed buffer part C1 of the first latch circuit L1 to the second high-speed buffer part C1 of the second latch circuit L2. The ECC circuit 130 performs the ECC process on the transferred SFDP data. After the transfer of the SFDP data is finished, the controller 150 immediately reads the initial data P0 from the block 0/page0 of the memory array 110. The read initial data P0 are kept in the first latch circuit L1 (S220). The ECC process on the SFDP data is performed during the period of reading the initial data P0. Such circumstance is shown in FIG. 7(B).

Figure 7C:
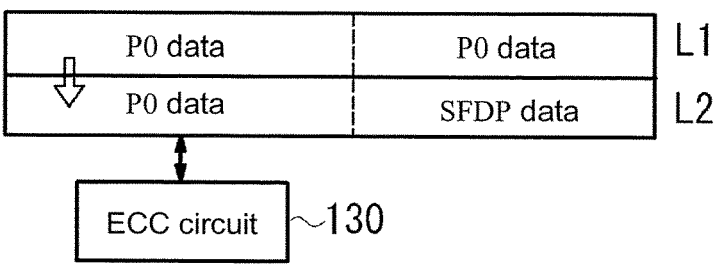

Then, the initial data P0 of the first high-speed buffer part C0 of the first latch circuit L1 are transferred to the first high-speed buffer part C0 of the second latch circuit L2. Consequently, as shown in FIG. 7(C), the initial data P0 are kept in the first high-speed buffer part C0 of the second latch circuit L2, and the SFDP data already undergoing the ECC process are kept in the second high-speed buffer part C1. Moreover, based on needs, the ECC process may also be performed on the initial data P0 of the first high-speed buffer part C0 of the second latch circuit L2.

Figure 7D:
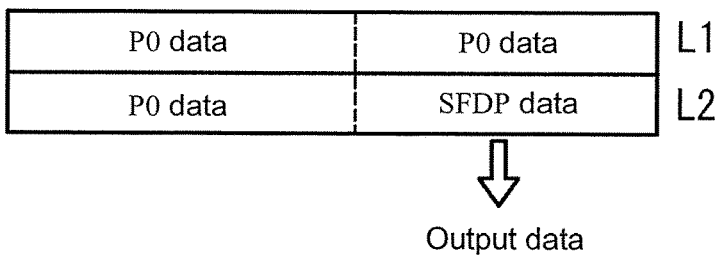

Then, the controller 150 determines the input command (S240). If the read command of the SFDP data is input, the SFDP data finishing with the ECC process and kept in the second high-speed buffer part C1 of the second latch circuit L2 are serially output in response to the external serial clock signal SCK. Such circumstance is shown in FIG. 7(D). Moreover, if needed, during the period of outputting the SFDP data, the ECC process may also be performed on the initial data P0 of the first high-speed buffer part C0 of the second latch circuit L2.

Figure 7E:
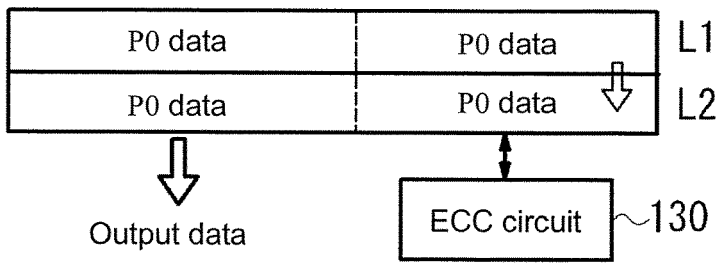

Alternatively, if the read command of the initial data is input, the controller 150 outputs the initial data P0 kept in the first high-speed buffer part C0 of the second latch circuit L2. In addition, through the transfer pulse generated in response to the read command, the remaining half of the initial data P0 kept in the second high-speed buffer part C1 of the first latch circuit L1 is transferred to the second high-speed buffer part C1 of the second latch circuit L2. In the process of outputting the initial data P0 of the first high-speed buffer part C0, the ECC process on the initial data P0 of the second high-speed buffer part C1 is performed (S260). After outputting the initial data P0 of the first high-speed buffer part C0, the initial data P0 of the second high-speed buffer part C1 are continuously output. Such circumstance is shown in FIG. 7(E).

Figure 7F:
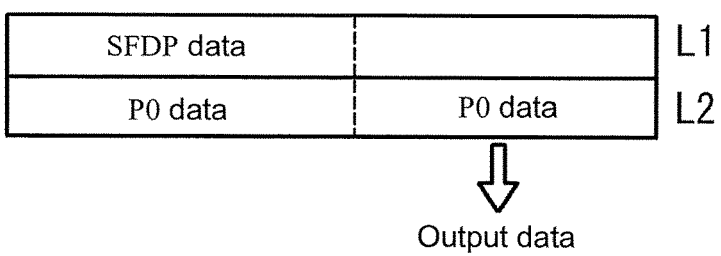

Under the circumstance that the read command of the SFDP data is input after the read command of the initial data, during the process of outputting the initial data P0, the controller 150 may read the SFDP data from the memory array 110 and keep the SFDP data in the first high-speed buffer part C0 of the first latch circuit L1. Such circumstance is shown in FIG. 7(F). Then, during the period of outputting the initial data P0 of the second high-speed buffer part C1 of the second latch circuit L2, the SFDP data of the first high-speed buffer part C0 of the first latch circuit L1 are transferred to the first high-speed buffer part C0 of the second latch circuit L2 and undergo the ECC process. Then, after the initial data P0 of the second high-speed buffer part C1 are output, the SFDP data finishing with the ECC process are output.

Accordingly, based on the second embodiment, by utilizing the operation starting period after the power is just turned on or reset, the SFDP data from the memory cell array are set in the second latch circuit L2 and undergo the ECC process. Therefore, under the circumstance that the read command of the SFDP data is input after the operation just starts, the SFDP data finishing with the ECC process may be read without latency.

In view of the foregoing, the preferred embodiments of the invention are described in detail. However, the invention shall not be limited to the specific embodiments. Various modifications and changes can be made without departing from the scope of the invention set forth in the claims. For example, the invention is suitable for any one of a flash memory whose memory cell stores binary data and a flash memory whose memory cell stores multi-value data. In addition, the invention is suitable for any one of a two-dimensional flash memory whose NAND strings of the memory array is formed on the surface of the substrate or a three-dimensional flash memory whose NAND strings are formed on a conductive layer (e.g., a polycrystalline layer) on the surface of the substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A reading method of an NAND flash memory, wherein:
the NAND flash memory comprises a page buffer having a first data keeping part keeping data read from a memory cell array and a second data keeping part keeping data transferred from the first data keeping part, and the NAND flash memory outputs the data kept in the second data keeping part in response to an external clock,
the reading method comprising:
during a period of after power is just turned on or reset until a reading operation starts, keeping data stored in a designated page of the memory cell array in the second data keeping part, and keeping parameter data in the first data keeping part, the parameter data is relating to a device and stored in an area not accessible to an user for programming;
controlling reading of the parameter data or the data of the designated page based on an input command of reading the data of the designated page from an external host;
transferring the parameter data kept in the first data keeping part to the second data keeping part under a circumstance that a command of reading the parameter data is input; and
after transferring the parameter data to the second data keeping part, outputting the parameter data in the second data keeping part transferred from the first data keeping part with an external serial clock signal,
wherein the second data keeping part comprises a first data keeping area and a second data keeping area, and after transferring the parameter data kept in the first data keeping part to the second data keeping part, an error checking correction process is performed on the parameter data kept in the first data keeping area during a period of outputting the data of the designated page kept in the second data keeping area.

2. The reading method as claimed in claim 1, further comprising:
outputting the data of the designated page kept in the second data keeping part under a circumstance that a command of reading the designated page is input.

3. The reading method as claimed in claim 1, wherein the reading method further comprises:
perform an error checking correction process on the data of the designated page kept in the second data keeping part.

4. The reading method as claimed in claim 1, further comprising
transferring the parameter data kept in the first data keeping part to the second data keeping part after outputting the data of the designated page kept in the second data keeping part under a circumstance that the command of reading the parameter data is input after the command of reading the designated page.

5. A reading method of an NAND flash memory, wherein:
the NAND flash memory comprises a page buffer having a first data keeping part keeping data read from a memory cell array and a second data keeping part keeping data transferred from the first data keeping part, and the NAND flash memory outputs the data kept in the second data keeping part in response to an external clock,
the reading method comprising:
during a period of after power is just turned on or reset until a reading operation starts, keeping parameter data stored in an area not accessible to the user for programming in the second data keeping part, and keeping data stored in a designated page of the memory cell array in the first data keeping part, and performing an error checking correction process on the parameter data during a period of reading the data of the designated page;
controlling reading of the parameter data or the data of the designated page based on an input command of reading the data of the designated page from an external host;
transferring the data kept in the first data keeping part to the second data keeping part under a circumstance that a command of reading the designated page is input; and
after transferring the parameter data to the second data keeping part, outputting the parameter data in the second data keeping part transferred from the first data keeping part with an external serial clock signal,
wherein the second data keeping part comprises a first data keeping area and a second data keeping area, and after transferring the parameter data kept in the first data keeping part to the second data keeping part, an error checking correction process is performed on the parameter data kept in the first data keeping area during a period of outputting the data of the designated page kept in the second data keeping area.

6. The reading method as claimed in claim 5, further comprising:
outputting the parameter data kept in the second data keeping part and already finishing with the error checking correction process under a circumstance that a command of reading the parameter data is input.

7. An NAND flash memory, comprising:
a memory cell array;
a page buffer, having a first data keeping part and a second data keeping part, wherein the first data keeping part keeps data read from the memory cell array, and the second data keeping part keeps data transferred from the first data keeping part; and
a read control element, performing control on reading the data kept in the second keeping part in response to an external clock,
wherein during a period of after power is just turned on or reset until a reading operation starts, the read control element keeps data stored in a designated page of the memory cell array in the second data keeping part, and keeps parameter data stored in an area not accessible to the user for programming in the first data keeping part, and controls reading of the parameter data or the data of the designated page based on an input command of reading the data of the designated page from an external host,
wherein the read control element transfers the parameter data kept in the first data keeping part to the second data keeping part under a circumstance that a command of reading the parameter data is input, after the read control element transfers the parameter data to the second data keeping part, the read control element outputs the parameter data in the second data keeping part transferred from the first data keeping part with an external serial clock signal,
wherein the second data keeping part comprises a first data storage part and a second data storage part, and after the read control element transfers the parameter data kept in the first data keeping part to the second data keeping part, data of the second data storage part are output during a period of performing the error checking correction process on data of the first data storage part, and the data of the first data storage part are output during a period of performing the error checking correction process on the data of the second data storage part, the parameter data are kept in the second data storage part, and the data of the designated page are kept in the first data storage part.

8. The flash memory as claimed in claim 7, wherein
the data kept in the second data keeping part are output under a circumstance that a command of reading the designated page is input.

9. An NAND flash memory, comprising:
a memory cell array;
a page buffer, having a first data keeping part and a second data keeping part, wherein the first data keeping part keeps data read from the memory cell array, and the second data keeping part keeps data transferred from the first data keeping part; and
an error checking correction process element, capable of performing an error checking correction process on the data kept in the second data keeping part; and
a read control element, performing control on reading the data kept in the second keeping part in response to an external clock,
wherein during a period of after power is just turned on or reset until a reading operation starts, the read control element performs the error checking correction process on parameter data, and controls reading of the parameter data or the data of the designated page based on an input command of reading the data of the designated page from an external host during keeping the parameter data stored in an area not accessible to the user for programming in the second data keep part and keeping data stored in a designated page of the memory cell array in the first data keep part,
wherein the read control element transfers the data kept in the first data keeping part to the second data keeping part under a circumstance that a command of reading the designated page is input, after the read control element transfers the parameter data to the second data keeping part, the read control element outputs the parameter data in the second data keeping part transferred from the first data keeping part with an external serial clock signal,
wherein the second data keeping part comprises a first data storage part and a second data storage part, and after the read control element transfers the parameter data kept in the first data keeping part to the second data keeping part, data of the second data storage part are output during a period of performing the error checking correction process on data of the first data storage part, and the data of the first data storage part are output during a period of performing the error checking correction process on the data of the second data storage part, the parameter data are kept in the second data storage part, and the data of the designated page are kept in the first data storage part.

10. The flash memory as claimed in claim 9, wherein the read control element outputs the parameter data kept in the second data keeping part and finishing with the error checking correction process under a circumstance that a command of reading the parameter data is input.

* * * * *